(12) United States Patent
Doohan

(10) Patent No.: US 6,559,047 B1
(45) Date of Patent: May 6, 2003

(54) METHOD OF FORMING A METAL INTERCONNECT THAT SUBSTANTIALLY REDUCES THE FORMATION OF INTERMETALLIC RESIDUE REGIONS

(75) Inventor: John Ian Doohan, Scotland (GB)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/057,429

(22) Filed: Jan. 24, 2002

(51) Int. Cl.[7] .......................................... H01L 21/4763
(52) U.S. Cl. ....................................... 438/629; 438/667
(58) Field of Search ................................. 438/625, 629, 438/637, 638, 642, 667, 669, 671, 635, 652, 654

(56) References Cited

U.S. PATENT DOCUMENTS 5,607,878 A  *  3/1997  Otsuka et al.
6,294,835 B1  *  9/2001  Dalal et al.

* cited by examiner

Primary Examiner—David Nelms
Assistant Examiner—Phuc T. Dang
(74) Attorney, Agent, or Firm—Mark C. Pickering

(57) ABSTRACT

The formation of intermetallic residue regions during the formation of a semiconductor metal layer, which has a base metal layer and a cap metal layer formed on the base metal layer, is substantially reduced by forming a layer of oxide on the base metal layer before the cap metal layer is deposited.

30 Claims, 3 Drawing Sheets

METHOD OF FORMING A METAL INTERCONNECT THAT SUBSTANTIALLY REDUCES THE FORMATION OF INTERMETALLIC RESIDUE REGIONS

BACKGROUND OF THE INVENTION

1. Field of the Invention

The present invention relates to a method of forming a metal interconnect and, more particularly, to a method of forming a metal interconnect that substantially reduces the formation of intermetallic residue regions.

2. Description of the Related Art

A metal interconnect is a semiconductor structure that electrically connects together the individual devices on a semiconductor substrate to realize a desired circuit function. Multiple layers of metal are typically needed to provide the required interconnections, with current-generation integrated circuits often employing up to seven layers of metal.

FIG. 1 shows a cross-sectional view that illustrates a conventional semiconductor wafer 100. As shown in FIG. 1, wafer 100 includes a semiconductor substrate 110, and a metal interconnect 112 that is formed on substrate 110. Metal interconnect 112 electrically connects together a number of semiconductor devices that have been formed on substrate 110 to realize a desired circuit function.

As further shown in FIG. 1, metal interconnect 112 has a first layer of isolation material 114 that is formed on substrate 110, and first and second contacts 116 and 118 that are formed through isolation layer 114. Further, interconnect 112 also has a first metal (metal-1) trace 120 that is formed on isolation layer 114 and contact 116, and a metal-1 trace 122 that is formed on isolation layer 114 and contact 118. Contacts 116 and 118 make electrical connections with the devices formed in substrate 110, such as a source or a drain region of a MOS transistor, while metal-1 traces 120 and 122 make electrical connections with contacts 116 and 118, respectively.

In addition, interconnect 112 has a second layer of isolation material 130, known as an intermetal dielectric, that is formed on first isolation layer 114 and metal-1 traces 120 and 122, and first and second vias 132 and 134 that are formed through isolation layer 130. Interconnect 112 also has a second metal (metal-2) trace 136 that is formed on isolation layer 130 and via 132, and a metal-2 trace 138 that is formed on isolation layer 130 and via 134. Vias 132 and 134 make electrical connections with metal-1 traces 120 and 122, respectively, and metal-2 traces 136 and 138, respectively.

During fabrication, after isolation layer 114 has been formed on substrate 110, and contacts 116 and 118 have been formed through isolation layer 114, wafer 100 is placed into a plasma vapor deposition chamber. Once inside the chamber, a vacuum is established. After the vacuum has been established, a base layer of metal, such as aluminum/copper (0.5%), is plasma vapor deposited on isolation layer 114 and contacts 116 and 118.

Following the deposition of the base metal layer, the vacuum is maintained and a cap layer of metal is plasma vapor deposited on the base metal layer. After the cap metal layer has been formed, the cap metal layer and the underlying base metal layer are etched to form metal-1 trace 120 and metal-1 trace 122. The same steps are utilized to form metal-2 traces 136 and 138.

The cap metal layer can be implemented with, for example, titanium-tungsten. Other materials, such as titanium, tend to produce intermetallic residues when used. Intermetallic residues are regions of material that are formed when the material of the cap metal layer reacts with the material of the base metal layer. For example, when titanium is formed on a layer of aluminum-copper, intermetallic residue regions of aluminum-copper-titanium can be formed.

The intermetallic residue regions are difficult to remove using reactive ion etching (RIE) or magnetically enhanced reactive ion etching (MERIE) because the regions are etched at a rate that is much slower than the etch rates of the titanium layer and the aluminum-copper layer. Thus, at the end of the etch step that forms metal-1 traces 120 and 122, intermetallic residue regions, which are electrically conductive, remain in areas which are designed to be free of conductive material. The remaining intermetallic residue regions, in turn, can provide undesirable leakage paths as well as direct shorts.

One common approach to removing slower etching materials, overetching, produces poor results because an overetch that is sufficient to remove the residue regions is likely to severely compromise the interconnect quality and thus render the process non-manufacturable by normal quality metrics. Thus, the formation of intermetallic residue regions is an undesirable side effect when using titanium to form the cap metal layer.

SUMMARY OF THE INVENTION

The present invention provides a method of forming a metal interconnect that substantially reduces the formation of intermetallic residue regions. The method of the present invention forms a metal interconnect on a wafer that has a semiconductor substrate, and a first layer of isolation material that is formed on the surface of the substrate. The semiconductor substrate has a surface and an active region on the surface of the semiconductor substrate. The wafer also has a contact that is formed through the first layer of isolation material to make an electrical connection with the active region on the surface of the semiconductor substrate.

In accordance with the present invention, the method includes the step of depositing a base layer of metal on the first layer of isolation material and the contact in a first vacuum. The method also includes the step of forming a layer of insulation material on the base layer of metal. The method further includes the step of depositing a cap layer of metal on the layer of insulation material in a second vacuum.

A better understanding of the features and advantages of the present invention will be obtained by reference to the following detailed description and accompanying drawings that set forth an illustrative embodiment in which the principles of the invention are utilized.

DETAILED DESCRIPTION

FIGS. 2A–2F show cross-sectional views that illustrate a method of forming a metal interconnect in accordance with the present invention. As described in greater detail below, the present invention substantially reduces the formation of intermetallic residues by forming a layer of oxide on the base metal layer before the cap metal layer is deposited.

Figure 1:
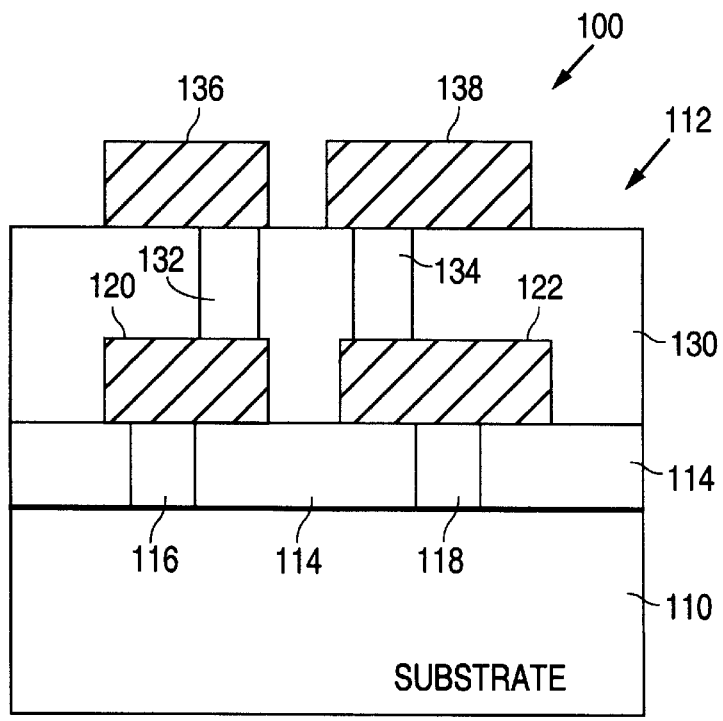
FIG. 1 is a cross-sectional view illustrating a conventional semiconductor wafer 100.
Figure 2A:
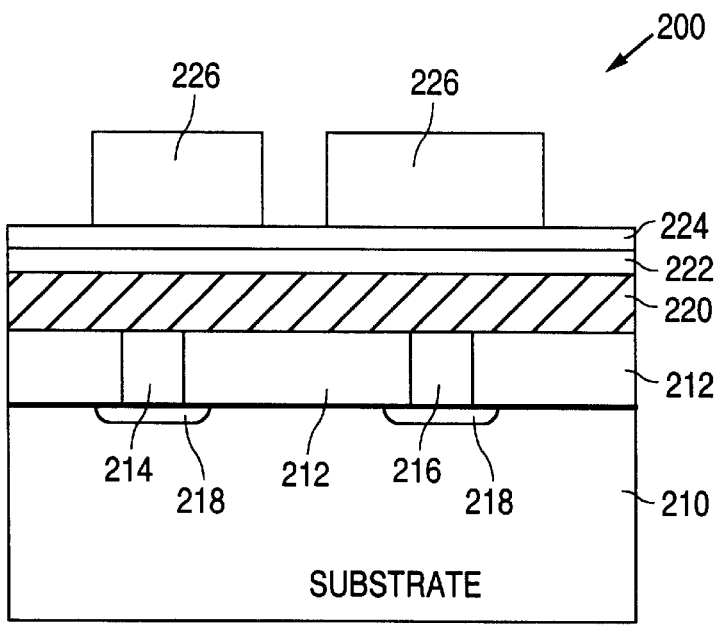
FIGS. 2A–2F are cross-sectional views illustrating a method of forming a metal interconnect in accordance with the present invention.

As shown in FIG. 2A, the method utilizes a wafer 200 has been conventionally processed to have a semiconductor substrate 210, and a first layer of isolation material 212 that is formed on substrate 210. Isolation layer 212 can be implemented with, for example, a layer of phosphorous-doped TEOS. In addition, wafer 200 also has a first contact 214 and a second contact 216 that are formed through isolation layer 212 to make electrical contacts with active regions 218, such as the source and drain regions of MOS transistors, on the surface of substrate 210.

The method of the present invention begins by placing wafer 200 into a plasma vapor deposition chamber. Once inside the chamber, a vacuum is established. After the vacuum has been established, as shown in FIG. 2A, a base layer of metal 220, such as aluminum/copper (0.5%), is plasma vapor deposited on isolation layer 212 and contacts 214 and 216.

Following the deposition of base metal layer 220, in accordance with the present invention, a layer of oxide 222 is formed on base metal layer 220. Oxide layer 222 can be formed by, for example, exposing wafer 200 to the atmosphere. After oxide layer 222 has been formed, a vacuum is again established, and a cap layer of metal 224, such as titanium, is plasma vapor deposited on oxide layer 222 in the vacuum.

In accordance with the present invention, by forming cap metal layer 224 on oxide layer 222 rather than directly on base metal layer 220, the method of the present invention substantailly reduces the formation of intermetallic residue regions. As a result, materials, such as titanium, can be used to form cap metal layer 224.

Figure 2B:
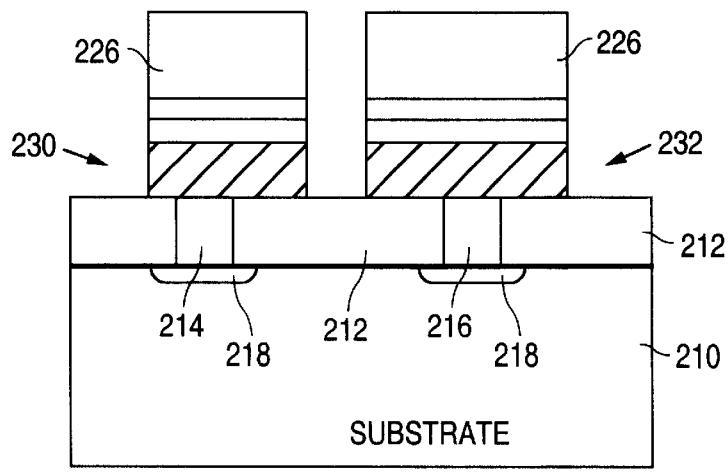

Returning to FIG. 2A, after cap metal layer 224 has been formed, a mask 226 is formed and patterned on metal layer 224. Next, as shown in FIG. 2B, the exposed regions of cap metal layer 224, and the underlying regions of oxide layer 222 and base metal layer 220, are etched to form a first metal-1 trace 230 and a second metal-1 trace 232. Metal-1 trace 230 is electrically connected to contact 214, while metal-1 trace 232 is electrically connected to contact 216. Following the etch, mask 226 is removed.

Figure 2C:
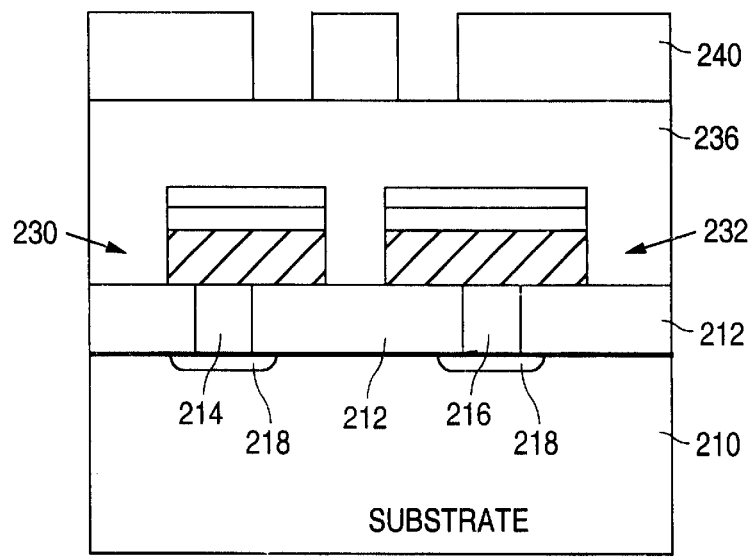
Figure 2D:
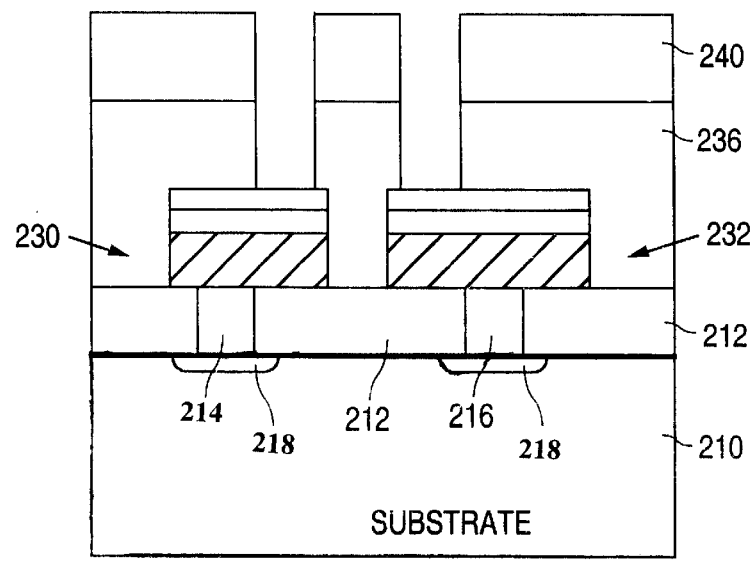

Once mask 226 has been removed, as shown in FIG. 2C, a second layer of isolation material 236 is formed on metal-1 trace 230, metal-1 trace 232, and the first layer of isolation material 212. Next, a mask 240 is formed and patterned on second isolation layer 236. Following this, as shown in FIG. 2D, the exposed regions of isolation layer 236 are etched until isolation layer 236 is removed from the underlying surfaces of metal-1 trace 230 and metal-1 trace 232. After the etch, mask 240 is removed.

Once mask 240 has been removed, a layer of metallic material, such as tungsten, is formed on second isolation layer 236 and the exposed regions of metal-1 traces 230 and 232. The layer of metallic material is then anisotropically etched until the layer of metallic material is removed from the top surface of isolation layer 236.

Figure 2E:
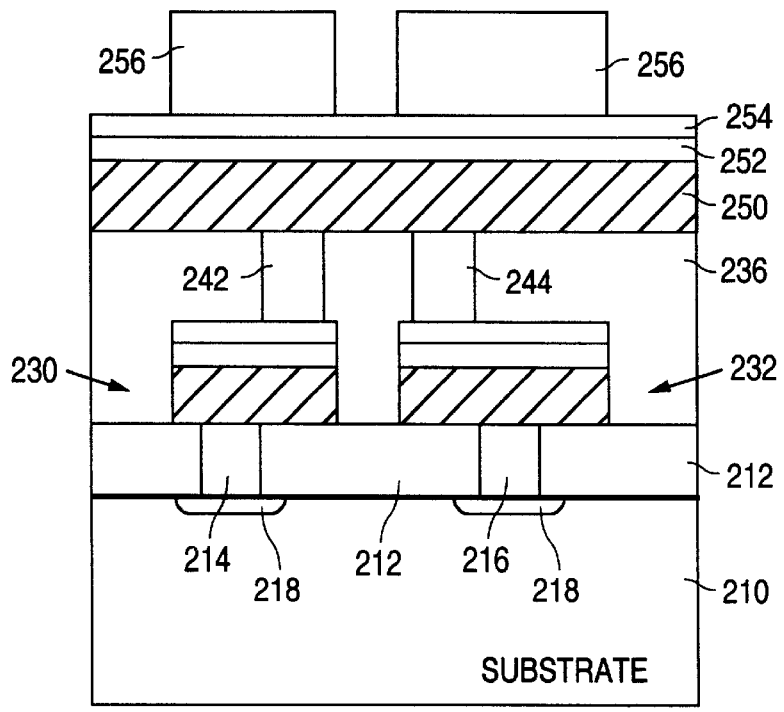

As shown in FIG. 2E, the etch forms a via 242 and a via 244 through second isolation layer 236 that make electrical connections with metal-1 traces 230 and 232, respectively. After the vias 242 and 244 have been formed, wafer 200 is again placed in the plasma vapor deposition chamber. Once inside the chamber, a vacuum is established.

After the vacuum has been established, a second layer of base metal 250, such as aluminum/copper (0.5%), is plasma vapor deposited on isolation layer 236 and vias 242 and 244. Following the deposition of base metal layer 250, in further accordance with the present invention, a second layer of oxide 252 is formed on base metal layer 250. Oxide layer 252 can be formed by, for example, exposing wafer 200 to the atmosphere. After oxide layer 252 has been formed, a vacuum is again established, and a second cap layer of metal 254, such as titanium, is plasma vapor deposited on oxide layer 252 in the vacuum.

Figure 2F:
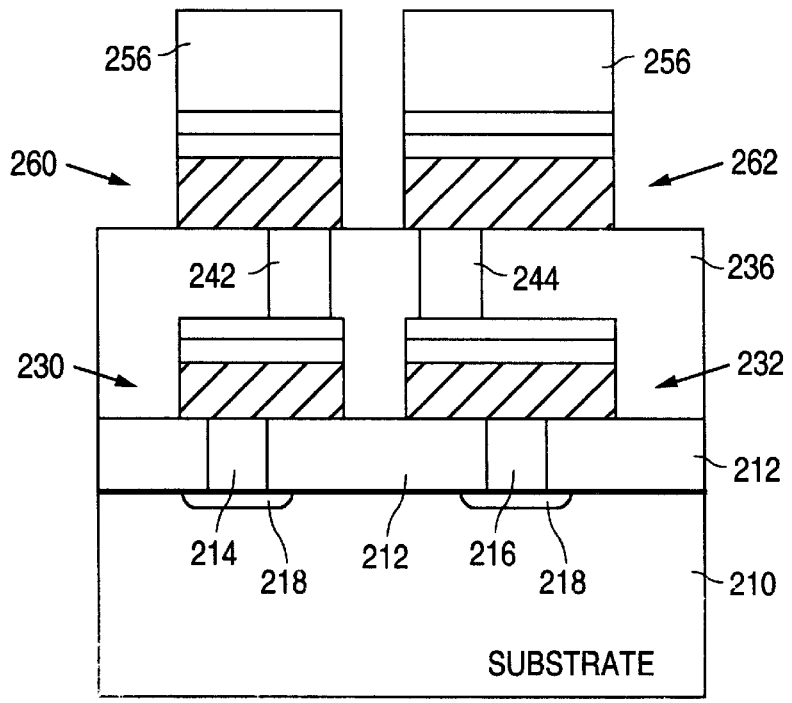

After cap metal layer 254 has been formed, a mask 256 is formed and patterned on cap metal layer 254. Next, as shown in FIG. 2F, the exposed regions of cap metal layer 254 and the underlying regions of oxide layer 252 and base metal layer 250 are etched to form a first metal-2 trace 260 and a second metal-2 trace 262. Following the etch, mask 256 is removed, and the process continues until all of the required metal layers have been formed.

Thus, a method of forming a metal interconnect in accordance with the present invention have been described. Experimental results indicate that by forming a layer of oxide on the base metal layer prior to forming the cap metal layer, the occurrence of intermetallic residues is substantially reduced.

It should be understood that various alternatives to the embodiments of the invention described herein may be employed in practicing the invention. For example, the cap layer of metal can be free of tungsten. The cap layer of metal can also consist of titanium, or consist essentially of titanium. The cap layer of metal can be free of tungsten. Further, the first and second cap layers of metal can be free of tungsten. The first and second cap layers of metal can consist of titanium, or consist essentially of titanium. Thus, it is intended that the following claims define the scope of the invention and that structures and methods within the scope of these claims and their equivalents be covered thereby.

What is claimed is:

1. A method of forming a metal interconnect on a wafer, the wafer having:

a semiconductor substrate having a surface and an active region on the surface of the semiconductor substrate;

a first layer of isolation material formed on the surface of the semiconductor substrate; and a contact formed through the first layer of isolation material to make an electrical connection with the active region on the surface of the semiconductor substrate, the method comprising the steps of:

depositing a first base layer of metal on the first layer of isolation material and the contact in a first vacuum;

forming a first layer of insulation material on the first base layer of metal; and depositing a cap layer of metal on the first layer of insulation material in a second vacuum.

2. The method of claim 1 wherein the base layer of metal includes aluminum.

3. A method of forming a metal interconnect on a wafer, the wafer having:

a semiconductor substrate having a surface and an active region on the surface of the semiconductor substrate, a first layer of isolation material formed on the surface of the semiconductor substrate, the first layer of insulation material including oxide, and a contact formed through the first layer of isolation material to make an electrical connection with the active region on the surface of the semiconductor substrate, the method comprising the steps of:
  depositing a first base layer of metal on the first layer of isolation material and the contact in a first vacuum;
  forming a first layer of insulation material on the first base layer of metal, the forming step including the step of exposing the wafer to oxygen to form the first layer of insulation material as a layer of oxide;
  depositing a cap layer of metal on the first layer of insulation material in a second vacuum.

4. The method of claim 2 wherein the cap layer of metal includes titanium.

5. The method of claim 4 wherein the cap layer of metal is free of tungsten.

6. The method of claim 2 wherein the cap layer of metal consists of titanium.

7. The method of claim 2 wherein the cap layer of metal consists essentially of titanium.

8. The method of claim 3 wherein the cap layer of metal includes titanium.

9. The method of claim 8 wherein the cap layer of metal is free of tungsten.

10. The method of claim 3 wherein the cap layer of metal consists of titanium.

11. The method of claim 3 wherein the cap layer of metal consists essentially of titanium.

12. A method of forming a metal interconnect on a wafer, the wafer having:
  a semiconductor substrate having a surface and an active region on the surface of the semiconductor substrate,
  a first layer of isolation material formed on the surface of the semiconductor substrate, and
  a contact formed through the first layer of isolation material to make an electrical connection with the active region on the surface of the semiconductor substrate,
the method comprising the steps of:
  depositing a first base layer of metal on the first layer of isolation material and the contact in a first vacuum;
  forming a first layer of insulation material on the first base layer of metal;
  depositing a cap layer of metal on the first layer of insulation material in a second vacuum;
  etching the cap layer of metal, the first layer of insulation material, and the base layer of metal to form a metal-1 trace that is connected to the contact;
  forming a second layer of isolation material on the first layer of isolation material and the metal-1 trace;
  forming a via through the second layer of isolation material to make an electrical connection with the metal-1 trace;
  depositing a second base layer of metal on the second layer of isolation material and the via in a third vacuum;
  forming a second layer of insulation material on the second base layer of metal; and
  depositing a second cap layer of metal on the second layer of insulation material in a fourth vacuum.

13. The method of claim 12 wherein the first and second base layers of metal include aluminum.

14. The method of claim 12 wherein:
  the first layer of insulation material includes oxide,
  the first forming step includes the step of exposing the wafer to oxygen to form the first layer insulation material as a layer of oxide;
  the second layer of insulation material includes oxide, and
  the second forming step includes the step of exposing the wafer to oxygen to form the second layer insulation material as a layer of oxide.

15. The method of claim 12 wherein the first and second cap layers of metal include titanium.

16. The method of claim 15 wherein the first and second cap layers of metal are free of tungsten.

17. The method of claim 12 wherein the first and second cap layers of metal consist of titanium.

18. The method of claim 12 wherein the first and second cap layers of metal consist essentially of titanium.

19. The method of claim 1 wherein the cap layer of metal includes titanium.

20. The method of claim 19 wherein the cap layer of metal is free of tungsten.

21. A method of forming a metal interconnect on a wafer, the wafer having:
  a semiconductor material having a surface and an active region on the surface of the semiconductor material,
  a first layer of isolation material formed on the surface of the semiconductor material, and
  a contact formed through the first layer of isolation material to make an electrical connection with the active region on the surface of the semiconductor material,
the method comprising the steps of:
  placing the wafer inside a chamber;
  establishing a first vacuum inside the chamber;
  depositing a base layer of metal on the first layer of isolation material and the contact in the first vacuum;
  removing the first vacuum;
  forming a first layer of insulation material on the base layer of metal after the first vacuum has been removed;
  establishing a second vacuum inside the chamber; and
  depositing a cap layer of metal on the first layer of insulation material in the second vacuum.

22. The method of claim 21 wherein the base layer of metal includes aluminum.

23. The method of claim 22 wherein:
  the first layer of insulation material includes oxide, and
  the forming step includes the step of exposing the wafer to oxygen to form the first layer of insulation material as a layer of oxide.

24. The method of claim 23 wherein the cap layer of metal includes titanium.

25. The method of claim 22 wherein the cap layer of metal includes titanium.

26. The method of claim 21 and further comprising the steps of:
  etching the cap layer of metal, the first layer of insulation material, and the base layer of metal to form a metal-1 trace that is connected to the contact; and
  forming a second layer of isolation material on the first layer of isolation material and the metal-1 trace.

27. The method of claim 26 wherein the base layer of metal includes aluminum.

28. The method of claim 27 wherein:
  the first layer of insulation material includes oxide, and
  the forming step includes the step of exposing the wafer to oxygen to form the first layer of insulation material as a layer of oxide.

29. The method of claim 28 wherein the cap layer of metal includes titanium.

30. The method of claim 27 wherein the cap layer of metal includes titanium.

* * * * *